United States Patent
Morishita

(10) Patent No.: US 9,892,886 B2
(45) Date of Patent: Feb. 13, 2018

(54) CHARGED PARTICLE BEAM SYSTEM AND METHOD OF ABERRATION CORRECTION

(71) Applicant: JEOL Ltd., Tokyo (JP)

(72) Inventor: Shigeyuki Morishita, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 15/617,186

(22) Filed: Jun. 8, 2017

(65) Prior Publication Data
US 2017/0365442 A1    Dec. 21, 2017

(30) Foreign Application Priority Data

Jun. 10, 2016 (JP) .................................. 2016-115978

(51) Int. Cl.
*H01J 37/153* (2006.01)
*H01J 37/28* (2006.01)

(52) U.S. Cl.
CPC ............ *H01J 37/153* (2013.01); *H01J 37/28* (2013.01)

(58) Field of Classification Search
USPC ....................................................... 250/396 R
See application file for complete search history.

(56) References Cited

U.S. PATENT DOCUMENTS 9,768,909 B2 * 9/2017 Huang ...................... H04J 14/04
2005/0024612 A1 * 2/2005 Hirukawa ............ G03F 7/70258
                                                        355/55

OTHER PUBLICATIONS

H. Haider et al., "Electron microscopy image enhanced", Nature, (1998), pp. 768-769, vol. 392.
Muller et al., "Advancing the Hexapole Cs-Corrector for the Scanning Transmission Electron Microscope", Microsc. Microanal, (2006), pp. 442-455, 12.
H. Rose, "Outline of a spherically corrected semiaplanatic medium-voltage transmission electron microscope", Optik, (1990), pp. 19-24, vol. 85, No. 1.
H. Sawada et al., "Correction of higher order geometrical aberration by triple 3-fold astigmatism field", Journal of Electron Microscopy, (2009), pp. 341-347, vol. 58(6).
H. Sawada et al., "Higher-order aberration corrector for an image-forming system in a transmission electron microscope", Ultramicroscopy, (2010), pp. 958-961, 110.

* cited by examiner

Primary Examiner — Kiet T Nguyen
(74) Attorney, Agent, or Firm — The Webb Law Firm

(57) ABSTRACT

There is provided a charged particle beam system for reducing phase variations in a charged particle beam due to sixth order three-lobe aberration. The charged particle beam system (100) is equipped with an aberration corrector (30) for correcting aberrations in the optical system, and includes: an aberration measuring section (44) for measuring sixth order three-lobe aberration of sixth order geometric aberration, a computing section (46) for computing the magnitude of at least one of fourth order three-lobe aberration of fourth order geometric aberration and three-fold astigmatism of second order geometric aberration for reducing phase variations in the charged particle beam due to the sixth order three-lobe aberration on the basis of the measured sixth order three-lobe aberration, and a controller (48) for controlling the aberration corrector (30) to produce at least one of the fourth order three-lobe aberration and the three-fold astigmatism on the basis of the computed magnitude.

6 Claims, 14 Drawing Sheets

CHARGED PARTICLE BEAM SYSTEM AND METHOD OF ABERRATION CORRECTION

BACKGROUND OF THE INVENTION

Field of the Invention

The present invention relates to a charged particle beam system and method of aberration correction.

Description of Related Art

In transmission electron microscopy, aberration correction is a technique that is important in achieving high-resolution imaging.

For example, H. Rose, Optik, vol. 85 (1990), pp. 19-24, H. Haider et al., Nature, vol. 392 (1998), pp. 768-769, and H. Muller et al., Microsc., Microanal. 12, pp. 442-455 (2006) disclose two-stage, three-fold field spherical aberration correctors in each of which there are arranged two stages of hexapole elements. In these known spherical aberration correctors, positive spherical aberration in an objective lens is corrected by negative spherical aberration produced by hexapole elements. In two-stage, three-fold field spherical aberration correctors, six-fold astigmatism of the fifth-order geometric aberration normally remains as a dominant aberration. However, the six-fold astigmatism can be corrected by adjusting the thickness of multipole elements or other factors.

H. Sawada et al., Journal of Electron Microscopy, vol. 58 (2009), pp. 341-347 and H. Sawada et al., Ultramicroscopy 110 (2010), pp. 958-961 disclose three-stage, three-fold field spherical aberration correctors in each of which there are arranged three stages of three-fold fields. In such a three-stage, three-fold field type spherical aberration corrector, six-fold astigmatism, which is difficult to correct with the above-described two-stage, three-fold field type spherical aberration correctors, is corrected by arranging three stages of three-fold fields.

As described above, in a two-stage, three-fold field type spherical aberration corrector, six-fold astigmatism can be corrected by adjusting the thickness of multipole elements or other factors. However, if the six-fold astigmatism is corrected, sixth order three-lobe aberration of sixth order geometric aberration cannot be corrected but rather remains as an aberration that limits the range of aberration correction.

Furthermore, as noted above, in a three-stage, three-fold field type spherical aberration corrector, six-fold astigmatism can be corrected. Also, in this three-stage, three-fold field type spherical aberration corrector, after six-fold astigmatism has been corrected, sixth order three-lobe aberration remains as a dominant aberration in the same manner as in a two-stage, three-fold field type spherical aberration corrector.

In this way, in a multistage, multipolar aberration corrector, even if aberrations are corrected up to the fifth order, sixth order three-lobe aberration remains. The range of aberration correction will be restricted by the effects of the sixth order three-lobe aberration. That is, the electron beam undergoes greater phase variations by the effects of the sixth order three-lobe aberration. This leads to a deterioration of the image resolution.

SUMMARY OF THE INVENTION

In view of the foregoing problem, the present invention has been made. One object associated with some aspects of the present invention is to provide a charged particle beam system capable of reducing phase variations in a charged particle beam due to sixth order three-lobe aberration. Another object associated with some aspects of the invention is to provide a method of aberration correction capable of reducing phase variations in a charged particle beam due to sixth order three-lobe aberration.

(1) A charged particle beam system associated with the present invention is equipped with an aberration corrector for correcting aberrations in an optical system. The charged particle beam system comprises: an aberration measuring section for measuring sixth order three-lobe aberration of sixth order geometric aberration; a computing section for computing the magnitude of at least one of fourth order three-lobe aberration of fourth order geometric aberration and three-fold astigmatism of second order geometric aberration for reducing phase variations in a charged particle beam due to the sixth order three-lobe aberration on the basis of the measured sixth order three-lobe aberration; and a controller for controlling the aberration corrector to produce at least one of the fourth order three-lobe aberration and the three-fold astigmatism on the basis of the computed magnitude.

In this charged particle beam system, at least one of the fourth order three-lobe aberration and the three-fold astigmatism is introduced into the sixth order three-lobe aberration that remains as a dominant aberration after correction of six-fold astigmatism in the aberration corrector, whereby phase variations in the charged particle beam due to the sixth order three-lobe aberration can be reduced. Consequently, in this charged particle beam system, image resolution can be improved.

(2) In one feature of the charged particle beam system of (1) above, the computing section may compute the magnitude of the fourth order three-lobe aberration and the magnitude of the three-fold astigmatism. The controller may control the aberration corrector to produce the fourth order three-lobe aberration such that an angular deviation of 60 degrees is induced between a three-fold field generated by the sixth order three-lobe aberration and a three-fold field generated by the fourth order three-lobe aberration. The controller may also control the aberration corrector to produce the three-fold astigmatism such that an angular deviation of 0 degree is induced between the three-fold field generated by the sixth order three-lobe aberration and a three-fold field generated by the three-fold astigmatism.

In this charged particle beam system, the fourth order three-lobe aberration and three-fold astigmatism are introduced into the sixth order three-lobe aberration that remains as a dominant aberration after correction of six-fold astigmatism in the aberration corrector. As a result, phase variations in the charged particle beam due to the sixth order three-lobe aberration can be reduced. Furthermore, in this charged particle beam system, the range of aberration correction can be extended as compared with the case where only fourth order three-lobe aberration or only three-fold astigmatism is introduced.

(3) In another feature of the charged particle beam system of (1) above, the computing section may compute the magnitude of the fourth order three-lobe aberration. The controller may control the aberration corrector to produce the fourth order three-lobe aberration such that an angular deviation of 60 degrees is induced between a three-fold field generated by the sixth order three-lobe aberration and a three-fold field generated by the fourth order three-lobe aberration.

In this charged particle beam system, fourth order three-lobe aberration is introduced into the sixth order three-lobe aberration that remains as a dominant aberration after correction of six-fold astigmatism in the aberration corrector. As a result, phase variations in the charged particle beam due to the sixth order three-lobe aberration can be reduced.

(4) In a further feature of the charged particle beam system of (1) above, the computing section may compute the magnitude of the three-fold astigmatism. The controller may control the aberration corrector to produce the three-fold astigmatism such that an angular deviation of 60 degrees is induced between a three-fold field generated by the sixth order three-lobe aberration and a three-fold field generated by the three-fold astigmatism.

In this charged particle beam system, three-fold astigmatism is introduced into the sixth order three-lobe aberration that remains as a dominant aberration after correction of six-fold astigmatism in the aberration corrector. As a result, phase variations in the charged particle beam due to the sixth order three-lobe aberration can be reduced.

(5) In one feature of the charged particle beam system of any one of (1)-(4) above, the aberration corrector may have a plurality of stages of multipole elements and transfer lens systems disposed between successive ones of the multipole elements. The controller may control the transfer lens systems to produce the fourth order three-lobe aberration. The controller may also control the multipole elements to produce the three-fold astigmatism.

In this charged particle beam system, phase variations in the charged particle beam due to the sixth order three-lobe aberration can be reduced easily.

(6) A method of aberration correction associated with the present invention is implemented in a charged particle beam system equipped with an aberration corrector having multiple stages of multipole elements. The method starts with measuring sixth order three-lobe aberration of sixth order geometric aberration. The magnitude of at least one of fourth order three-lobe aberration of fourth order geometric aberration and three-fold astigmatism of second order geometric aberration for reducing phase variations in a charged particle beam due to the sixth order three-lobe aberration is computed on the basis of the measured sixth order three-lobe aberration. The aberration corrector is caused to produce at least one of the fourth order three-lobe aberration and the three-fold astigmatism on the basis of the computed magnitude.

In this method of aberration correction, at least one of the fourth order three-lobe aberration and the three-fold astigmatism is introduced into the sixth order three-lobe aberration that remains as a dominant aberration after correction of six-fold astigmatism in the aberration corrector, whereby phase variations in the charged particle beam due to the sixth order three-lobe aberration can be reduced. Therefore, in this method of aberration correction, image resolution can be enhanced.

DESCRIPTION OF THE INVENTION

The preferred embodiments of the present invention are hereinafter described in detail with reference to the drawings. It is to be understood that the embodiments described below are not intended to unduly restrict the content of the present invention set forth in the appended claims and that not all the configurations described below are essential constituent components of the invention.

In the following description, an electron microscope which irradiates a sample with an electron beam to observe, analyze, and otherwise process the sample is taken as one example of a charged particle beam system associated with the present invention. The charged particle beam system associated with the present invention may also be an instrument which irradiates a sample with a charged particle beam other than an electron beam such as ions to observe, analyze, and otherwise process the sample.

1. First Embodiment 1.1. Configuration of Electron Microscope

Figure 1:
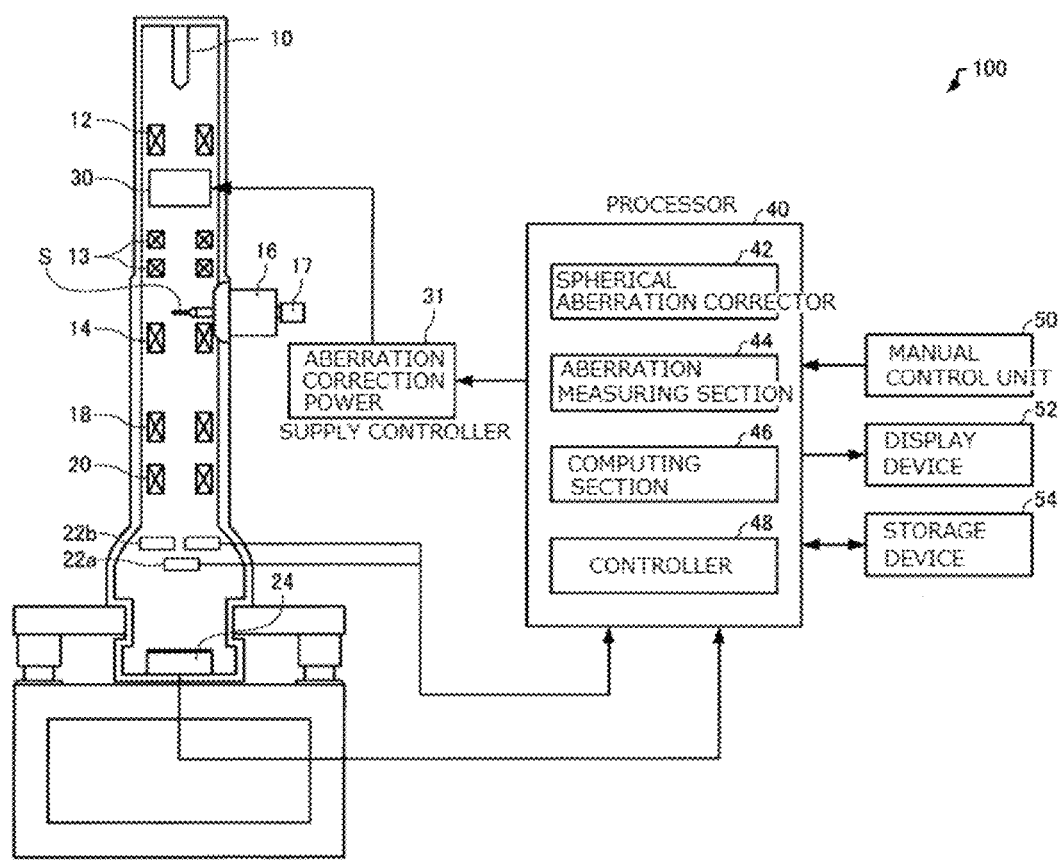
FIG. 1 is a schematic cross section, partly in block form, of an electron microscope associated with a first embodiment of the present invention.

An electron microscope associated with a first embodiment of the present invention is first described by referring to FIG. 1, which schematically shows the electron microscope, 100.

The electron microscope 100 is a scanning transmission electron microscope (STEM) equipped with an aberration corrector 30. The scanning transmission electron microscope is an instrument for obtaining a scanning transmission electron microscope (STEM) image by scanning an electron probe (focused ion beam) over a sample S and detecting electrons transmitted through the sample S.

As shown in FIG. 1, the electron microscope 100 includes an electron source 10, a condenser lens system 12, scan coils 13, an objective lens 14, a sample stage 16, a sample holder 17, an intermediate lens 18, a projector lens 20, STEM detectors 22a, 22b, an imager 24, the aberration corrector 30, a processor 40, a manual control unit 50, a display device 52, and a storage device 54.

The electron source 10 produces electrons. For example, the electron source 10 is an electron gun that emits an electron beam by accelerating electrons, emitted from a cathode, by means of an anode.

The condenser lens system 12 focuses the electron beam emitted from the electron source 10. The condenser lens system 12 may be composed of a plurality of electron lenses (not shown). The condenser lens system 12 and objective lens 14 together constitute an illumination system for focusing the electron beam onto the sample S.

The scan coils 13 operate to deflect the electron beam such that the electron beam (electron probe) focused by the condenser lens system 12 and objective lens 14 is scanned over the sample S on the basis of a scan signal generated by a control unit (not shown) of the electron microscope 100. Thus, the electron probe can be scanned over the sample S.

The objective lens 14 is used to focus the electron beam onto the sample S and to form the electron probe. Furthermore, the objective lens 14 focuses the electron beam transmitted through the sample S.

The sample stage 16 holds the sample S. In the illustrated example, the sample stage 16 holds the sample S via the sample holder 17. The sample stage 16 permits the sample S to be moved horizontally or vertically and tilted.

The intermediate lens 18 and projector lens 20 cooperate to guide the electrons transmitted through the sample S toward the STEM detectors 22a and 22b. The intermediate lens 18 and projector lens 20 further magnify the image focused by the objective lens 14 and focus the image onto the imager 22. The objective lens 14, intermediate lens 18, and projector lens 20 together constitute an imaging system of the electron microscope 100.

The bright-field STEM detector 22a detects electrons which are transmitted through the sample S without being scattered and electrons scattered at angles less than a given angle out of the electrons transmitted through the sample S. Although the bright-field STEM detector 22a is disposed on the optical axis, the detector 22a can be retracted from the optical axis when the imager 24 is used.

The dark-field STEM detector 22b detects electrons scattered at a certain angle from the sample S. The dark-field STEM detector 22b is an annular detector.

The imager 24 captures the image focused by the imaging system. The imager 24 is, for example, a digital camera such as a CCD camera.

The aberration corrector 30 is incorporated in the illumination system of the electron microscope 100. In the illustrated example, the aberration corrector 30 is disposed in a stage following the condenser lens system 12. The aberration corrector 30 is used to correct aberrations in the illumination system of the electron microscope 100. In particular, the aberration corrector 30 is a spherical aberration corrector that corrects spherical aberration in the illumination system by creating negative spherical aberration so as to cancel out positive spherical aberration in the illumination system.

In the electron microscope 100, the electron beam emitted from the electron source 10 is focused as an electron probe onto the sample S by the condenser lens system 12 and objective lens 14. At this time, aberrations in the electron beam made to impinge on the sample S are corrected by the aberration corrector 30. The electron beam hitting the sample S is scanned over the sample S by the scan coils 13. The electron beam transmitted through the sample S is guided by the objective lens 14, intermediate lens 18, and projector lens 20 onto the STEM detectors 20a and 20b, where the beam is detected. The detectors 22a and 22b send detection signals indicative of the intensities of the detected electrons to the processor 40. The processor 40 visualizes the detection signals emanating from the STEM detectors 22a and 22b in synchronism with a scan signal and generates a bright-field STEM image and a dark-field STEM image, respectively.

Furthermore, in the electron microscope 100, a projected image (Ronchigram) of the sample formed at a diffraction plane can be obtained by the imager 24 by focusing the electron beam to the vicinity of the sample S by means of the illumination system. Information about the image captured by the imager 24 is sent to the processor 40.

Figure 2:
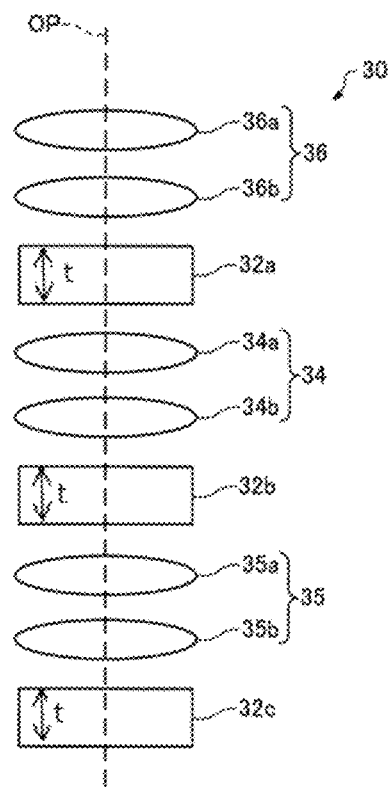
FIG. 2 is a schematic diagram of an aberration corrector included in the electron microscope shown in FIG. 1.

FIG. 2 schematically illustrates the aberration corrector 30. The aberration corrector 30 has three stages of multipole elements 32a, 32b, and 32c. That is, the aberration corrector 30 is a three-stage, three-fold field type spherical aberration corrector.

The aberration corrector 30 is configured including the three stages of multipole elements (first multipole element 32a, second multipole element 32b, and third multipole element 32c), a first transfer lens system 34, and a second transfer lens system 35. In the aberration corrector 30, the first multipole element 32a, second multipole element 32b, and third multipole element 32c are arranged in a line along an optical axis OP.

The first multipole element 32a produces a three-fold field, i.e., a three-fold symmetric field. Similarly, each of the second multipole element 32b and third multipole element 32c produces a three-fold field. A three-fold field referred to herein is a field whose strength has three-fold symmetry.

The first multipole element 32a is made, for example, of a dodecapole (12-pole) element. No restriction is placed on the number of poles of the first multipole element 32a. The three-fold field generated by the first multipole element 32a is an electrostatic field, a static magnetic field, or a superimposition thereof. The second multipole element 32b and third multipolar element 32c are identical in configuration to the first multipole element 32a.

The first multipole element 32a, second multipole element 32b, and third multipole element 32c have a thickness t along the optical axis OP. In a multipole element having a thickness, aberrations different from aberrations produced in a thin multipole element appear as combination aberrations. Where a three-fold field is produced by a multipole element, negative spherical aberration is induced as the combination aberrations. Utilizing this, positive spherical aberration in the optical system can be corrected.

Furthermore, in the aberration corrector 30, six-fold astigmatism produced by a combination of aberrations produced in three-fold fields which are generated respectively by the three stages of multipole elements 32a, 32b, and 32c can be canceled out by establishing a given angular relationship among these 3 three-fold fields.

The first transfer lens system 34 is disposed between the first multipole element 32a and the second multipole element 32b. The first transfer lens system 34 is composed of a pair of transfer lenses (first transfer lens 34a and second transfer lens 34b). An image conjugate to the image formed by the first multipole element 32a is formed in the second multipole element 32b by the first transfer lens system 34.

The second transfer lens system 35 is disposed between the second multipole element 32b and the third multipole element 32c. The second transfer lens system 35 is composed of a pair of transfer lenses (first transfer lens 35a and second transfer lens 35b). An image conjugate to the image generated by the second multipole element 32b is formed in the third multipole element 32c by the second transfer lens system 35.

A further transfer lens system 36 may be positioned between the condenser lens system 12 and the first multipole element 32a. This transfer lens system 36 is composed of a pair of transfer lenses (first transfer lens 36a and second transfer lens 36b).

The manual control unit 50 performs processing for obtaining a control signal responsive to a user's manipulation and sending the signal to the processor 40. The function of the manual control unit 50 can be realized, for example, by buttons, keys, a touch panel display, a microphone, or the like.

The display device 52 operates to display the image generated by the processor 40. The function of the display device 52 can be accomplished by an LCD, a CRT, or the like. Captured STEM images and others are displayed on the display device 52.

Programs, data, and related information permitting the processor 40 to perform various computational operations and control operations are stored in the storage device 54. Furthermore, the storage device 54 is used as a working area for the processor 40. The storage device 54 is also used to temporarily store the results of computations executed by the processor 40 in accordance with various programs. The function of the storage device 54 can be implemented by a hard disc, a RAM, or the like.

The processor 40 performs various processing operations including a subroutine for aberration correction (described later) and a subroutine for generating STEM images in response to detection signals from the STEM detectors 22a and 22b. The functions of the processor 40 can be implemented either by hardware such as various processors (e.g., a CPU or a DSP) or by software. The processor 40 includes a spherical aberration corrector 42, an aberration measuring section 44, a computing section 46, and a controller 48.

The spherical aberration corrector 42 controls the aberration corrector 30 such that the spherical aberration in the illumination system is corrected. The spherical aberration corrector 42 controls the aberration corrector 30 on the basis of the results of measurements of aberrations made by the aberration measuring section 44 as described later. Furthermore, the spherical aberration corrector 42 controls the aberration corrector 30 in such a way that six-fold astigmatism is corrected in addition to spherical aberration.

The aberration measuring section 44 performs processing to measure aberrations, for example, using an SRAM (segmental Ronchigram autocorrelation function matrix) method or a probe tableau method.

The SRAM method is a technique for computing aberrations from the shapes of autocorrelation functions by obtaining a Ronchigram, dividing it into segments, and deriving the autocorrelation functions of the segments. A Ronchigram is a projected image (figure) of the sample formed on a diffraction plane by focusing an electron beam to the vicinity of the sample S by the illumination system.

The probe tableau method is a technique for measuring aberrations based on a probe image obtained by capturing STEM images with different angles of illumination of the electron beam on the sample surface and deconvoluting the STEM images.

The aberration measuring section 44 measures sixth order three-lobe aberration in the subroutine for aberration correction (described later). The sixth order three-lobe aberration referred to herein is sixth order geometric aberration. The sixth order three-lobe aberration creates a three-fold field, i.e., a three-fold symmetric field. The aberration measuring section 44 measures aberrations other than the sixth order three-lobe aberration, for example, fourth order three-lobe aberration of fourth order geometric aberration, three-fold astigmatism of second order geometric aberration, and spherical aberration.

In geometric optics where a trajectory of electrons is described as a motion of charged particles within an electromagnetic field, the deviation of an imaging point from an ideal imaging point (Gaussian image point) is referred to as geometric aberration. Generally, optical characteristics are given by a power-series polynomial which makes a mapping from one point on an object plane to one point on an image plane. This polynomial is expanded into a power series, using the distance r of the electron trajectory at the object plane from the optical axis and the angle $\alpha$ to the optical axis as parameters. Where only the first order terms of r and a are taken into account, ideal Gaussian imaging free from aberration is represented. Where second order terms and higher are taken into consideration, the imaging point deviates from the ideal image point. Both the angle $\alpha$ to the optical axis and the order of the distance r from the optical axis give the order of geometric aberration.

The computing section 46 computes the magnitude of the fourth order three-lobe aberration for reducing phase variations in the electron beam due to sixth order three-lobe aberration, based on the sixth order three-lobe aberration measured by the aberration measuring section 44.

In the aberration corrector 30, the sixth order three-lobe aberration remains as a dominant aberration after correction of the spherical aberration and six-fold astigmatism. At this time, the phase variations in the electron beam due to the sixth order three-lobe aberration can be reduced by introducing the fourth order three-lobe aberration into the aberration corrector 30.

Figure 3:
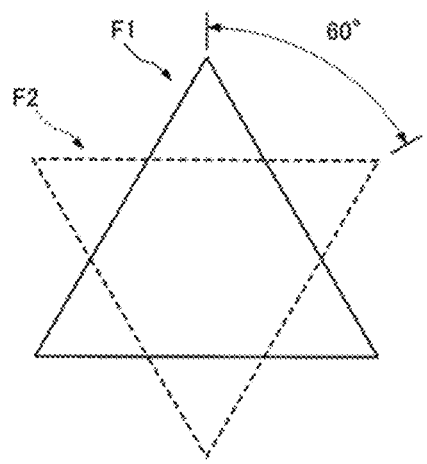
FIG. 3 is a diagram illustrating an angular relationship between a three-fold field generated by sixth order three-lobe aberration and a three-fold field generated by fourth order three-lobe aberration.

FIG. 3 is a diagram illustrating an angular relationship between a three-fold field F1 generated by the sixth order three-lobe aberration and a three-fold field F2 generated by the fourth order three-lobe aberration.

As illustrated in FIG. 3, the fourth order three-lobe aberration for reducing phase variations in the electron beam due to the sixth order three-lobe aberration is introduced in such a way that an angular deviation of 60 degrees occurs between the three-fold field F1 generated by the sixth order three-lobe aberration and the three-fold field F2 generated by the fourth order three-lobe aberration. Consequently, the three-fold symmetric aberrations cancel out each other, whereby the phase variations in the electron beam due to the sixth order three-lobe aberration can be reduced.

Because the three-fold fields F1 and F2 are three-fold symmetric, if they are rotated through 120 degrees or 240 degrees, they return to their original positions. Therefore, the angular deviation between the three-fold fields F1 and F2 is herein stipulated to be in the range from 0 degree to less than 120 degrees.

Where the magnitude of the sixth order three-lobe aberration is $R_7$ (mm), if an allowable amount of phase variation is k (rad), the magnitude of the fourth order three-lobe aberration for reducing phase variations in the electron beam due to the sixth order three-lobe aberration is given by $$R_5 = -\left(\frac{35k\lambda}{4}\right)^{\frac{2}{7}} R_7^{\frac{5}{7}} \quad (1)$$

where λ is the wavelength of the electron beam. The allowable amount of phase variation k gives a range within which the phase of the electron beam is allowed to vary and corresponds to the amounts of phase variation at the extreme values of the graph of FIG. 5C described later.

For example, where the sixth order three-lobe aberration is 10 mm, assuming that the allowable amount of phase variation k is π/4 and the wavelength λ of the electron beam is 0.0049 nm (accelerating voltage is 60 kV), a computation using Eq. (1) above results in the magnitude $R_5$ of the fourth order three-lobe aberration to be 27.3 μm.

The controller 48 controls the aberration corrector 30 based on the results of computation performed by the computing section 46 to produce fourth order three-lobe aberration. The results of computation performed by the computing section 46 include information about the magnitude of the fourth order three-lobe aberration and information about the angle of the three-fold field generated by the fourth order three-lobe aberration. The fourth order three-lobe aberration can be produced by adjusting the first transfer lens system 34 and second transfer lens system 35.

Figure 4A:
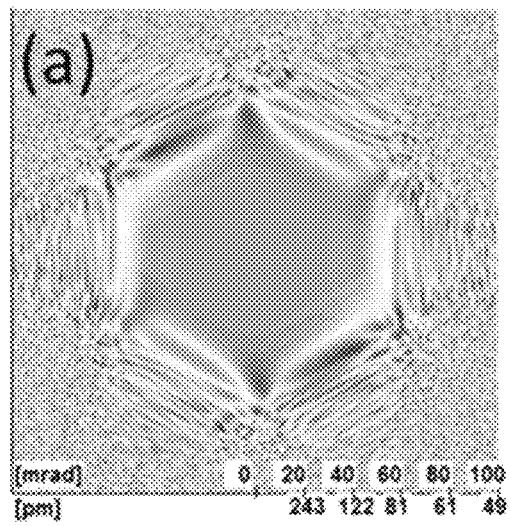
FIG. 4A is a Ronchigram taken computationally under the condition where sixth order three-lobe aberration is assumed to be 10 mm.
Figure 4B:
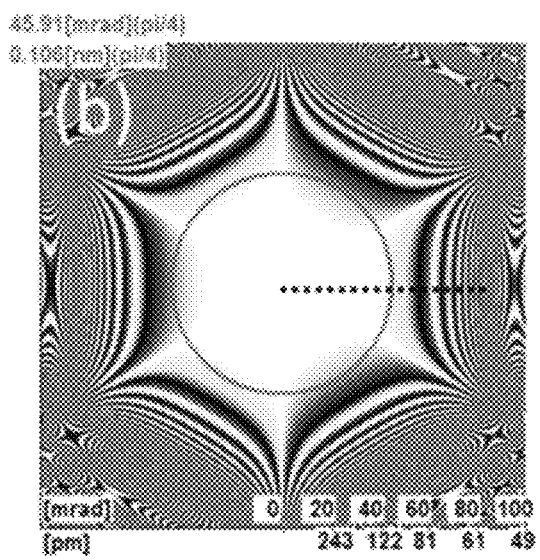
FIG. 4B is a diagram showing a phase distribution computed under the condition where sixth order three-lobe aberration is assumed to be 10 mm.
Figure 4C:
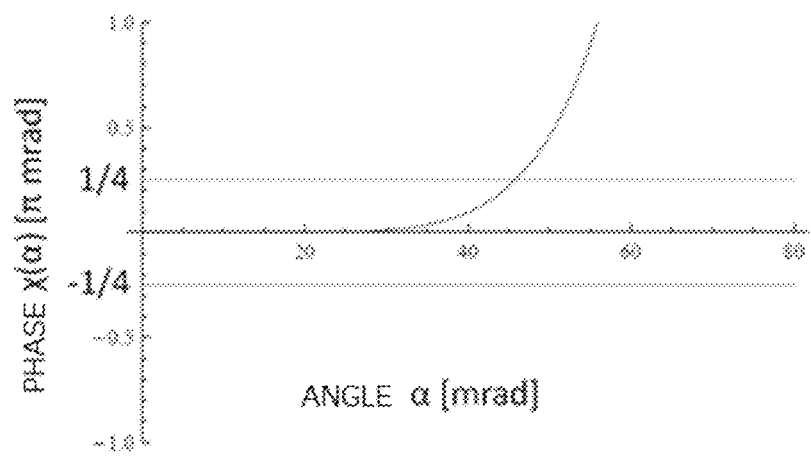
FIG. 4C shows a profile taken along a dotted line shown in FIG. 4B.

FIG. 4A is a Ronchigram taken computationally in a case where the sixth order three-lobe aberration is assumed to be 10 mm. FIG. 4B shows a phase distribution computed in a case where the sixth order three-lobe aberration is assumed to be 10 mm. FIG. 4C shows a profile taken along a dotted line shown in FIG. 4B.

Figure 5A:
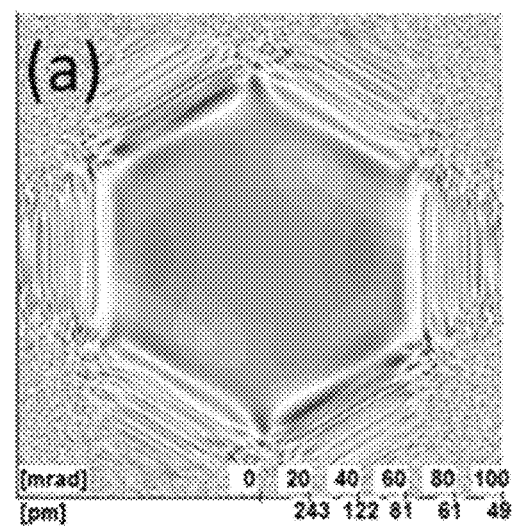
FIG. 5A is a Ronchigram taken computationally under conditions where sixth order three-lobe aberration and fourth order three-lobe aberration are assumed to be 10 mm and 27.3 μm, respectively.
Figure 5B:
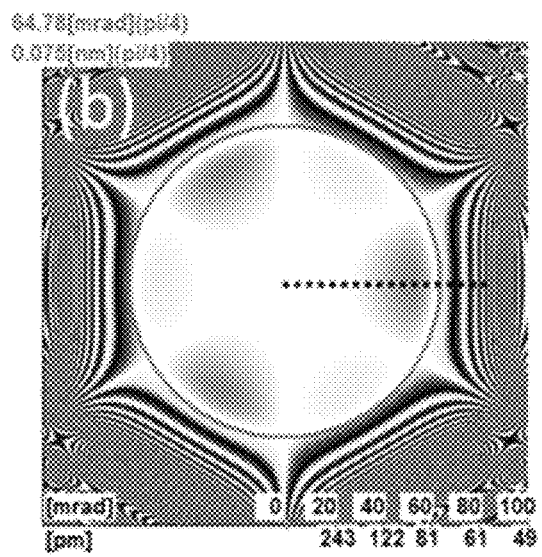
FIG. 5B is a diagram showing a phase distribution computed under conditions where sixth order three-lobe aberration and fourth order three-lobe aberration are assumed to be 10 mm and 27.3 μm, respectively.
Figure 5C:
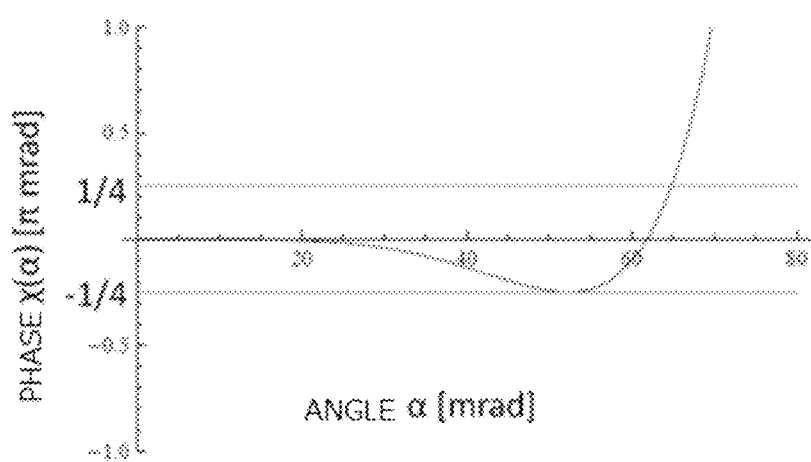
FIG. 5C is a diagram showing a profile taken along a dotted line shown in FIG. 5B.

FIG. 5A is a Ronchigram taken computationally under conditions where the sixth order three-lobe aberration is 10 mm and the fourth order three-lobe aberration is 27.3 μm. FIG. 5B is a phase distribution produced computationally under conditions where the sixth order three-lobe aberration is 10 mm and the fourth order three-lobe aberration is 27.3 μm. FIG. 5C shows a profile taken along a dotted line shown in FIG. 5B.

As shown in FIGS. 4A, 4B, and 4C, in a case where there was only sixth order three-lobe aberration, the range of aberration correction was 46 mrad. On the other hand, as shown in FIGS. 5A, 5B, and 5C, in a case where fourth order three-lobe aberration was added to the sixth order three-lobe aberration, the magnitude of the sixth order three-lobe aberration was identical to that shown in FIGS. 4A, 4B, and 4C but the range of aberration correction was broadened to 65 mrad. That is, the addition of the fourth order three-lobe aberration could reduce phase variations in the electron beam due to the sixth order three-lobe aberration. The range of aberration correction referred to herein is a range in which the amount of phase variation is equal to or less than an allowable amount of phase variation (π/4, here).

1.2. Operation of Electron Microscope

Figure 6:
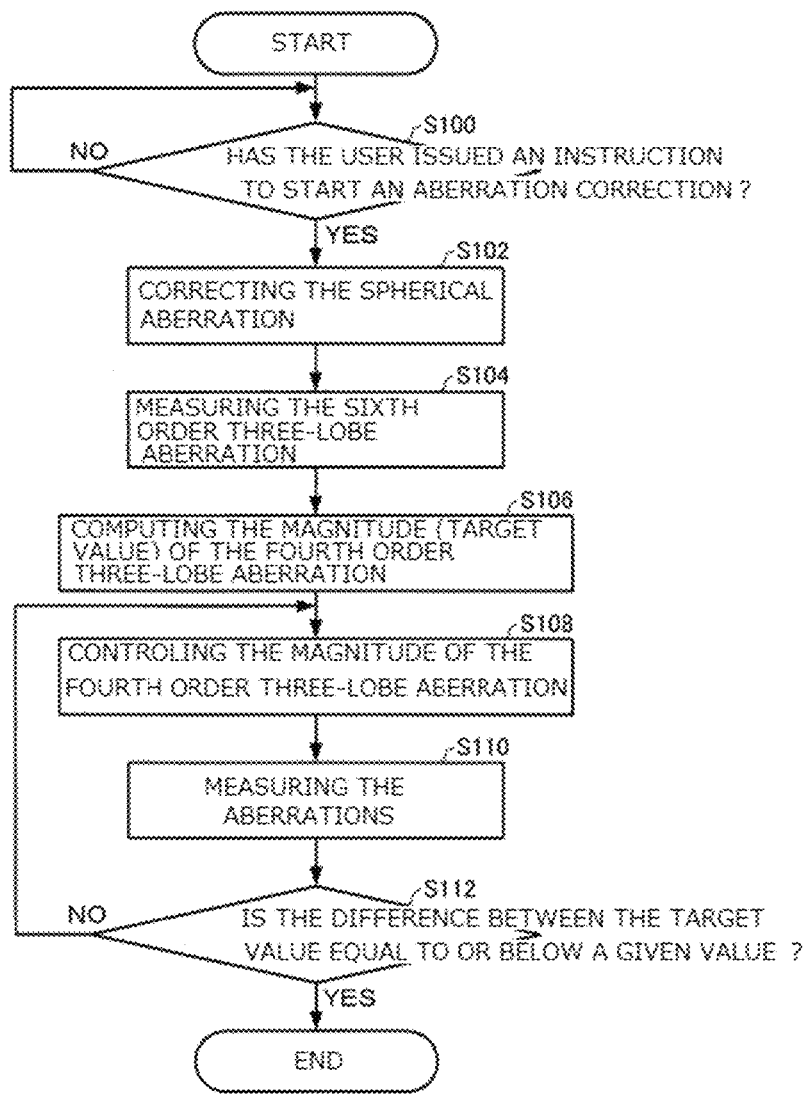
FIG. 6 is a flowchart illustrating one example of subroutine for aberration correction performed by the processor of the electron microscope of FIG. 1.

The operation of the electron microscope 100 is next described. The subroutine for aberration correction performed by the processor 40 of the electron microscope 100 is described below. FIG. 6 is a flowchart illustrating one example of the subroutine for aberration correction performed by the processor 40 of the electron microscope 100.

First, the processor 40 makes a decision as to whether the user has issued an instruction to start an aberration correction (step S100). If the manual control unit 50 is manipulated to start the correction, the processor 40 determines that the user has issued an instruction for starting an aberration correction.

If the decision at step S100 is YES, indicating that an instruction for starting an aberration correction has been issued, the spherical aberration corrector 42 operates to control the aberration corrector 30 such that spherical aberration and six-fold astigmatism are corrected (step S102).

The spherical aberration corrector 42 creates a control signal on the basis of the result of the measurement of aberrations made by the aberration measuring section 44 and sends the signal to an aberration correction power supply controller 31. The aberration corrector 30 is thus set into operation, and spherical aberration and six-fold astigmatism are corrected. However, the sixth order three-lobe aberration remains as a dominant aberration.

Then, the aberration measuring section 44 measures the sixth order three-lobe aberration by an SRAM method or probe-tableau method (step S104).

For instance, where an SRAM method is adopted, the aberration measuring section 44 obtains a Ronchigram, divides it into segments, obtains autocorrelation functions of the segments, and computes aberrations. Where a probe tableau method is adopted, the aberration measuring section 44 derives STEM images which have been captured with different angles of impingement of the electron beam on the sample surface, deconvolutes the STEM images to produce a probe image, and measures aberrations.

The computing section 46 then computes a magnitude (target value) of the fourth order three-lobe aberration for reducing phase variations in the electron beam due to the sixth order three-lobe aberration on the basis of the sixth order three-lobe aberration measured by the aberration measuring section 44 (step S106).

The computing section 46 computes the magnitude (target value) of the fourth order three-lobe aberration using Eq. (1) above.

The controller 48 then controls the aberration corrector 30 to produce fourth order three-lobe aberration on the basis of the magnitude of the fourth order three-lobe aberration computed by the computing section 46 (step S108).

In particular, the controller 48 generates a control signal based on the computed magnitude of the fourth order three-lobe aberration to control the aberration corrector 30 (first transfer lens system 34 and second transfer lens system 35), and sends the signal to the aberration correction power supply controller 31. As a consequence, fourth order three-lobe aberration is induced in the aberration corrector 30.

The aberration measuring section 44 measures aberrations by an SRAM method or probe-tableau method (step S110).

The controller 48 then makes a decision as to whether the difference between the measured magnitude of the fourth order three-lobe aberration and the target value is equal to or below a given value (step S112).

If the decision at step S112 is NO, indicating that the difference between the measured magnitude of the fourth order three-lobe aberration and the target value is not equal to or below the given value, then the controller 48 controls the aberration corrector 30 based on the measured magnitude of the fourth order three-lobe aberration such that the magnitude of the fourth order three-lobe aberration approaches the target value (step S108).

During the operation of step S110, if the measured aberrations include aberrations other than the sixth order three-lobe aberration and fourth order three-lobe aberration, the processing of step S108 may include an operation for controlling the aberration corrector 30 so as to correct these other aberrations.

The controller 48 and aberration measuring section 44 repeat the steps S108, S110, and S112 such that the magnitude of the fourth order three-lobe aberration approaches the target value.

If the controller 48 determines that the difference between the measured magnitude of the fourth order three-lobe aberration and the target value is equal to or below the given value (i.e., the decision at step S112 is YES), the processor 40 ends the subroutine for aberration correction.

The electron microscope 100 has the following features. In the electron microscope 100, the aberration measuring section 44 measures sixth order three-lobe aberration. The computing section 46 computes the magnitude of fourth order three-lobe aberration on the basis of the measured sixth order three-lobe aberration. The controller 48 controls the aberration corrector 30 to produce fourth order three-lobe aberration on the basis of the magnitude computed by the computing section 46. Therefore, in the electron microscope 100, fourth order three-lobe aberration is introduced into the sixth order three-lobe aberration that remains as a dominant aberration after correction of six-fold astigmatism in the aberration corrector 30. Consequently, phase variations in the electron beam due to the sixth order three-lobe aberration can be reduced. That is, the range of aberration correction can be extended. Hence, the electron microscope 100 can provide improved image resolution.

In the electron microscope 100, the controller 48 controls the aberration corrector 30 to produce fourth order three-lobe aberration such that an angular deviation of 60 degrees is induced between the three-fold field produced by the sixth order three-lobe aberration and the three-fold field produced by the fourth order three-lobe aberration. Consequently, the sixth order three-lobe aberration and the fourth order three-lobe aberration cancel out each other, and the range of aberration correction can be extended.

In the electron microscope 100, the controller 48 controls the first transfer lens system 34 and second transfer lens system 35 to produce fourth order three-lobe aberration. Therefore, phase variations in the electron beam due to sixth order three-lobe aberration can be reduced easily.

The method of aberration correction associated with the first embodiment involves the steps of: measuring sixth order three-lobe aberration; computing the magnitude of fourth order three-lobe aberration for reducing phase variations in the electron beam due to the sixth order three-lobe aberration on the basis of the measured sixth order three-lobe aberration; and causing the aberration corrector 30 to produce fourth order three-lobe aberration on the basis of the computed magnitude of fourth order three-lobe aberration. Therefore, phase variations in the electron beam due to the sixth order three-lobe aberration that remains as a dominant aberration after correction of six-fold astigmatism in the aberration corrector 30 can be reduced. Consequently, image resolution can be improved.

2. Second Embodiment 2.1. Configuration of Electron Microscope

An electron microscope associated with a second embodiment is next described. Only the differences with the electron microscope 100 associated with the first embodiment are described below; a description of similarities is omitted.

In the above-described electron microscope 100 associated with the first embodiment, phase variations in the electron beam due to sixth order three-lobe aberration are reduced by introducing fourth order three-lobe aberration. On the other hand, in the electron microscope associated with the second embodiment, phase variations in the electron beam due to sixth order three-lobe aberration are reduced by introducing three-fold astigmatism.

The electron microscope associated with the second embodiment is identical in configuration to the electron microscope 100 associated with the first embodiment shown in FIG. 1 and consequently its description and illustration is omitted.

In the present embodiment, the computing section 46 computes the magnitude of the three-fold astigmatism for reducing phase variations in the electron beam due to sixth order three-lobe aberration on the basis of the sixth order three-lobe aberration measured by the aberration measuring section 44.

Figure 7:
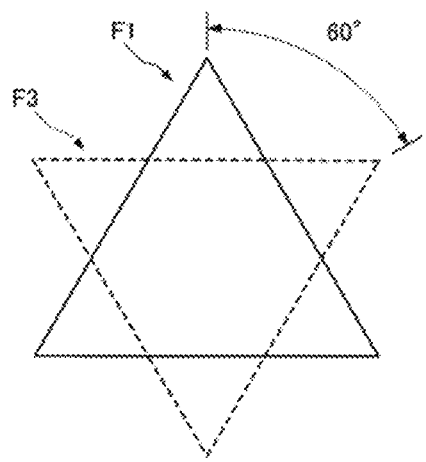
FIG. 7 is a diagram illustrating an angular relationship between a three-fold field generated by sixth order three-lobe aberration and a three-fold field generated by three-fold astigmatism.

FIG. 7 is a diagram illustrating an angular relationship between a three-fold field F1 generated by sixth order three-lobe aberration and a three-fold field F3 generated by three-fold astigmatism. As shown in this FIG. 7, the three-fold astigmatism is introduced such that an angular deviation of 60 degrees occurs between the three-fold field F1 generated by the sixth order three-lobe aberration and the three-fold field F3 generated by the three-fold astigmatism. Consequently, the aberrations of three-fold symmetry cancel each other out and thus phase variations in the electron beam due to the sixth order three-lobe aberration can be reduced.

In a case where the magnitude of the sixth order three-lobe aberration is $R_7$ (mm), if it is assumed that the allowable amount of phase variation is k (rad), then the magnitude $A_3$ of three-fold astigmatism for reducing phase variations in the electron beam due to the sixth order three-lobe aberration is given by $$A_3 = -\left(\frac{21k\lambda}{8}\right)^{\frac{4}{7}} R_7^{\frac{3}{7}} \qquad (2)$$

For example, where the sixth order three-lobe aberration is 10 mm, a computation using Eq. (2) above under conditions where the allowable amount of phase variation k is π/4 and the wavelength of the electron beam λ, is 0.0049 nm (accelerating voltage is 60 kV) results in the magnitude $A_3$ of the three-fold astigmatism being equal to 37.5 nm.

In the present embodiment, the controller 48 controls the aberration corrector 30 based on the results of the computation performed by the computing section 46 to produce three-fold astigmatism. The results of the computation performed by the computing section 46 include information about the magnitude of the three-fold astigmatism and information about the angle of the three-fold field generated by the three-fold astigmatism. The three-fold astigmatism can be produced by adjusting at least one of the first multipole element 32*a*, second multipole element 32*b*, and third multipole element 32*c*.

Figure 8A:
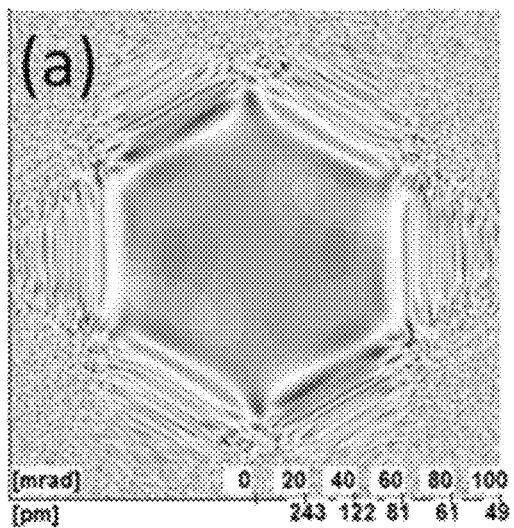
FIG. 8A is a Ronchigram taken computationally under conditions where sixth order three-lobe aberration and three-fold astigmatism are assumed to be 10 mm and 37.5 nm, respectively.
Figure 8B:
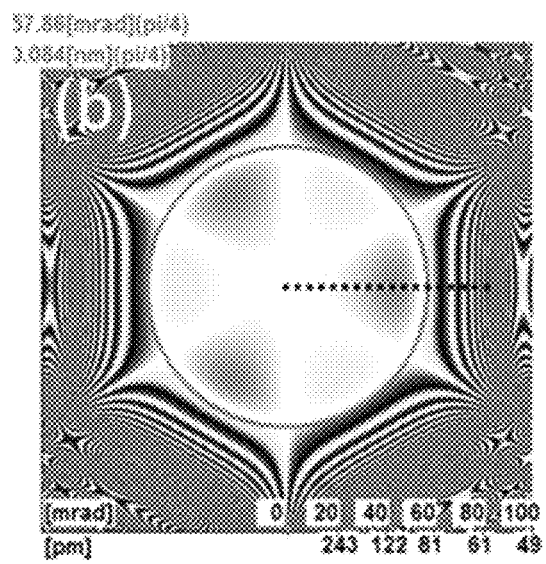
FIG. 8B is a diagram showing a phase distribution computed under conditions where sixth order three-lobe aberration and three-fold astigmatism are assumed to be 10 mm and 37.5 nm, respectively.
Figure 8C:
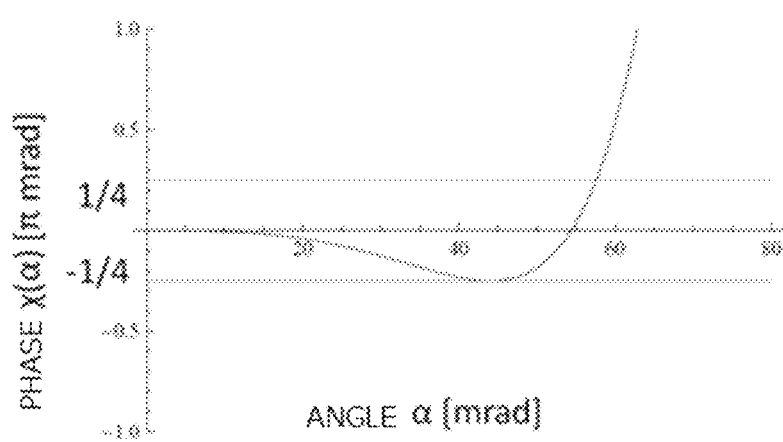
FIG. 8C is a diagram showing a profile taken along a dotted line shown in FIG. 8B.

FIG. 8A is a Ronchigram taken computationally under conditions where the sixth order three-lobe aberration was 10 mm and the three-fold astigmatism was 37.5 nm. FIG. 8B shows a phase distribution computed under conditions where the sixth order three-lobe aberration was 10 mm and the three-fold astigmatism was 37.5 nm. FIG. 8C shows a profile taken along a dotted line shown in FIG. 8B.

As shown in FIGS. 4A, 4B, and 4C, in a case where only sixth order three-lobe aberration was present, the range of aberration correction was 46 mrad. On the other hand, as shown in FIGS. 8A, 8B, and 8C, in a case where three-fold astigmatism was added to the sixth order three-lobe aberration, the magnitude of the sixth order three-lobe aberration remained the same as in the case of FIGS. 4A, 4B, and 4C but the range of aberration correction was spread to 58 mrad.

2.2. Operation of Electron Microscope

Figure 9:
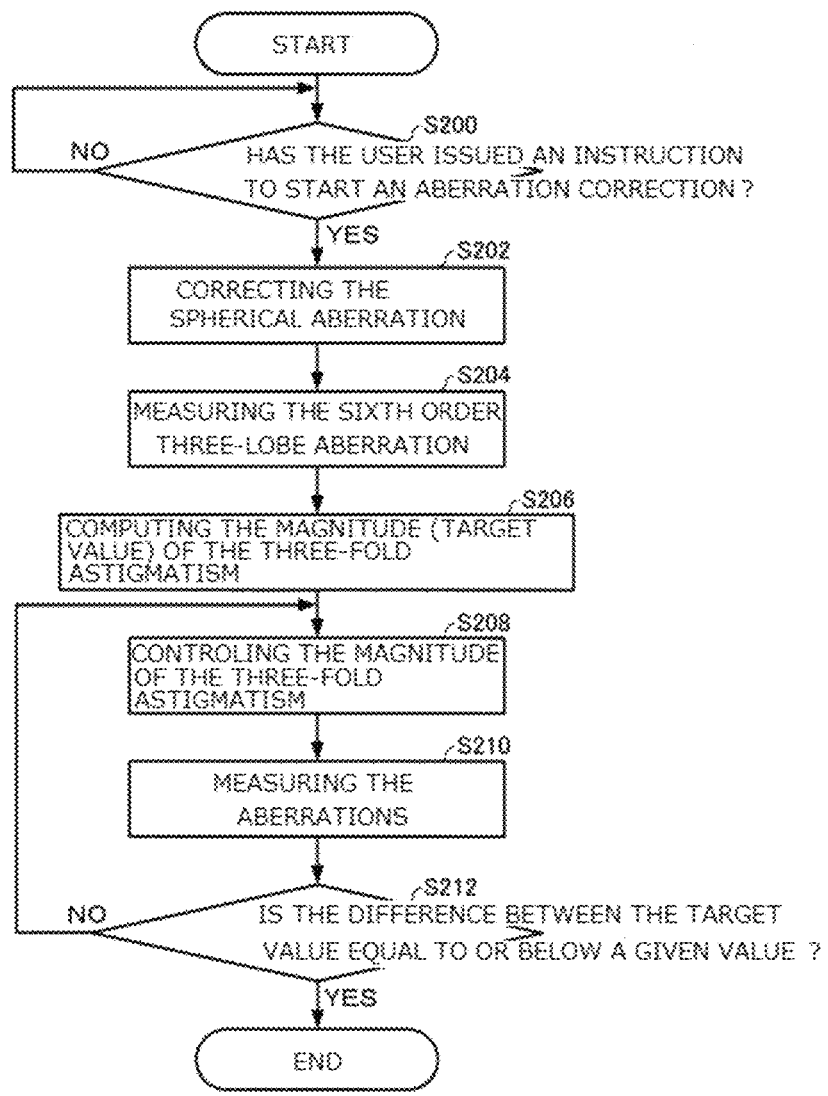
FIG. 9 is a flowchart illustrating one example of subroutine for aberration correction performed by a processor included in an electron microscope associated with a second embodiment.

The operation of the electron microscope associated with a second embodiment is next described. FIG. 9 is a flowchart illustrating one example of subroutine for aberration correction performed by the processor 40 of the electron microscope associated with the second embodiment.

The operations of steps S200, S202, and S204 illustrated in FIG. 9 are performed similarly to the operations of steps S100, S102, and S104, respectively, illustrated in the above cited FIG. 6.

After sixth order three-lobe aberration is measured by the aberration measuring section 44 (after step S204), the computing section 46 computes the magnitude (target value) of three-fold astigmatism for reducing phase variations in the electron beam due to the sixth order three-lobe aberration on the basis of the sixth order three-lobe aberration measured by the aberration measuring section 44 (step S206).

The computing section 46 computes the magnitude (target value) of the three-fold astigmatism using Eq. (2) above.

Then, the controller 48 controls the aberration corrector 30 to produce three-fold astigmatism on the basis of the magnitude of the three-fold astigmatism computed by the computing section 46 (step S208).

In particular, the controller 48 generates a control signal for controlling the aberration corrector 30 (i.e., at least one of the first multipole element 32*a*, second multipole element 32*b*, and third multipole element 32*c*) on the basis of the computed magnitude of the three-fold astigmatism and sends the signal to the aberration correction power supply controller 31. Consequently, the three-fold astigmatism is produced in the aberration corrector 30.

The aberration measuring section 44 then measures aberrations by an SRAM method or a three-lobe method (step S210).

The controller 48 then makes a decision as to whether the difference between the measured magnitude of the three-fold astigmatism and the target value is equal to or below a given value (step S212).

If the decision at step S212 is NO, indicating that the difference between the measured magnitude of the three-fold astigmatism and the target value is not equal to or below a given value, the controller 48 controls the aberration corrector 30 based on the measured three-fold astigmatism such that the magnitude of the three-fold astigmatism approaches the target value (step S208).

The controller 48 and aberration measuring section 44 repeat the operations of steps S208, S210, and S212 to bring the magnitude of the three-fold astigmatism closer to the target value.

If the decision at step S212 is YES, indicating that the controller 48 has determined that the difference between the measured magnitude of the three-fold astigmatism and the target value is equal to or below a given value, then the processor 40 ends the subroutine for aberration correction.

The electron microscope associated with the second embodiment has the following features. In the electron microscope associated with the second embodiment, the aberration measuring section 44 measures sixth order three-lobe aberration. The computing section 46 computes the magnitude of the three-fold astigmatism on the basis of the measured sixth order three-lobe aberration. The controller 48 controls the aberration corrector 30 to produce three-fold astigmatism on the basis of the magnitude computed by the computing section 46. Therefore, in the electron microscope associated with the second embodiment, the aberration corrector 30 can reduce phase variations in the electron beam due to sixth order three-lobe aberration by introducing three-fold astigmatism into sixth order three-lobe aberration that remains as a dominant aberration after correction of six-fold astigmatism. Consequently, in the electron microscope associated with the second embodiment, image resolution can be improved in the same way as in the above-described electron microscope 100 associated with the first embodiment.

In the electron microscope associated with the second embodiment, the controller 48 controls the aberration corrector 30 to produce three-fold astigmatism such that an angular deviation of 60 degrees is produced between the three-fold field generated by the sixth order three-lobe aberration and the three-fold field generated by the three-fold astigmatism. In consequence, the sixth order three-lobe aberration and the three-fold astigmatism cancel each other out. As a result, the range of aberration correction can be extended.

In the electron microscope associated with the second embodiment, the controller 48 produces the three-fold astigmatism by controlling at least one of the first multipole element 32*a*, second multipole element 32*b*, and third multipole element 32*c*. Therefore, phase variations in the electron beam due to the sixth order three-lobe aberration can be reduced easily.

The method of aberration correction associated with the second embodiment involves the steps of: measuring sixth order three-lobe aberration, computing the magnitude of three-fold astigmatism for reducing phase variations in the electron beam due to the sixth order three-lobe aberration on the basis of the measured magnitude of the sixth order three-lobe aberration, and causing the aberration corrector 30 to produce the three-fold astigmatism on the basis of the computed magnitude of the three-fold astigmatism. Therefore, phase variations in the electron beam due to the sixth order three-lobe aberration that remains as a dominant aberration in the aberration corrector 30 after correction of the six-fold astigmatism can be reduced, and hence image resolution can be improved.

3. Third Embodiment

3.1. Configuration of Electron Microscope

An electron microscope associated with a third embodiment is next described. Only differences with the above-described electron microscopes associated with the first and second embodiments, respectively, are described below; a description of similarities is omitted.

In the above-described electron microscope 100 associated with the first embodiment, phase variations in the electron beam due to sixth order three-lobe aberration are reduced by introducing fourth order three-lobe aberration. Furthermore, in the electron microscope associated with the second embodiment, phase variations in the electron beam due to sixth order three-lobe aberration are reduced by introducing three-fold astigmatism.

On the other hand, in the electron microscope associated with the third embodiment, phase variations in the electron beam due to sixth order three-lobe aberration are reduced by introducing fourth order three-lobe aberration and three-fold astigmatism.

The electron microscope associated with the third embodiment is identical in configuration to the electron microscope 100 associated with the first embodiment shown in FIG. 1 and so its description and illustration is omitted.

In the present embodiment, the computing section 46 computes the magnitude of fourth order three-lobe aberration and the magnitude of three-fold astigmatism for reducing phase variations in the electron beam due to sixth order three-lobe aberration on the basis of the sixth order three-lobe aberration measured by the aberration measuring section 44.

Figure 10:
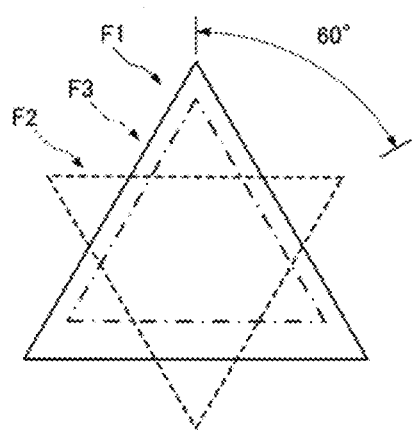
FIG. 10 is a diagram showing an angular relationship among a three-fold field generated by sixth order three-lobe aberration, a three-fold field generated by fourth order three-lobe aberration, and a three-fold field generated by three-fold astigmatism.

FIG. 10 is a diagram illustrating the angular relationship among the three-fold field F1 generated by the sixth order three-lobe aberration, the three-fold field F2 generated by the fourth order three-lobe aberration, and the three-fold field F3 generated by the three-fold astigmatism.

As shown in FIG. 10, the fourth order three-lobe aberration is introduced such that an angular deviation of 60 degrees is induced between the three-fold field F1 generated by the sixth order three-lobe aberration and the three-fold field F2 generated by the fourth order three-lobe aberration. Furthermore, the three-fold astigmatism is introduced in such a way that an angular deviation of 0 degree occurs between the three-fold field F1 generated by the sixth order three-lobe aberration and the three-fold field F3 generated by the three-fold astigmatism. That is, there is no angular deviation between the three-fold field F1 and the three-fold field F3. In this way, the aberrations of three-fold symmetry are made to cancel each other out by introducing fourth order three-lobe aberration and three-fold astigmatism into the sixth order three-lobe aberration. Hence, phase variations in the electron beam caused by the sixth order three-lobe aberration can be reduced.

Let $\chi$ be an aberration function given by the following Eq. (3). Where the magnitude of the sixth order three-lobe aberration is $R_7$ (mm), the magnitude $R_5$ of the fourth order three-lobe aberration and the magnitude $A_3$ of the three-fold astigmatism for reducing phase variations in the electron beam due to the sixth order three-lobe aberration can be found by solving simultaneous equations of Eqs. (4) for $R_5$ and $R_3$.

$$\chi(\alpha) = \frac{2\pi}{\lambda}\left(\frac{1}{3}A_3\alpha^3 + \frac{1}{5}R_5\alpha^5 + \frac{1}{7}R_7\alpha^7\right) \quad (3)$$

-continued $$\begin{cases} \chi\left(\frac{-R_5 - \sqrt{R_5^2 - 4R_7A_3}}{2R_7}\right) = k_1\pi \\ \chi\left(\frac{-R_5 + \sqrt{R_5^2 - 4R_7A_3}}{2R_7}\right) = -k_2\pi \end{cases} \quad (4)$$

where $k_1$ is an allowable amount of phase variation on the lower angle side and $k_2$ is an allowable amount of phase variation on the higher angle side.

For example, where the sixth order three-lobe aberration is 10 mm and assuming that the allowable amount of phase variation $k_1$ is $\pi/4$, the allowable amount of phase variation $k_2$ is $\pi/4$, and the wavelength $\lambda$ of the electron beam is 0.0049 nm (the accelerating voltage is 60 kV), a computation using Eqs. (4) above leads to results where the magnitude $R_5$ of the fourth order three-lobe aberration is 63 pill and the magnitude $A_3$ of the three-fold astigmatism is 78 nm.

In the present embodiment, the controller 48 controls the aberration corrector 30 to produce fourth order three-lobe aberration and three-fold astigmatism on the basis of the result of computation performed by the computing section 46. The fourth order three-lobe aberration can be produced by adjusting the first transfer lens system 34 and the second transfer lens system 35. The three-fold astigmatism can be generated by adjusting at least one of the first multipole element 32a, second multipole element 32b, and third multipole element 32c.

Figure 11A:
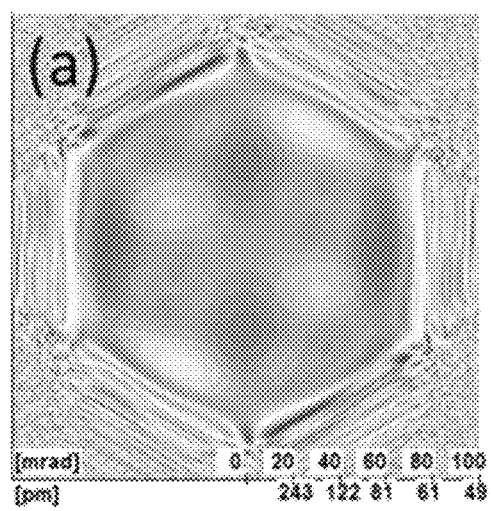
FIG. 11A is a Ronchigram taken computationally under conditions where sixth order three-lobe aberration, fourth order three-lobe aberration, and three-fold astigmatism are assumed to be 10 mm, 63 μm, and 78 nm, respectively.
Figure 11B:
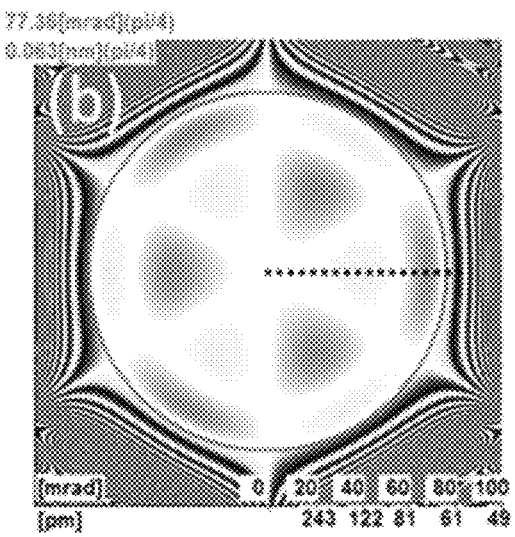
FIG. 11B is a diagram showing a phase distribution computed under conditions where sixth order three-lobe aberration, fourth order three-lobe aberration, and three-fold astigmatism are assumed to be 10 mm, 63 μm, and 78 nm, respectively.

FIG. 11A is a Ronchigram computed under conditions where the sixth order three-lobe aberration was 10 mm, the fourth order three-lobe aberration was 63 µm, and the three-fold astigmatism was 78 nm. FIG. 11B shows a phase distribution computed under conditions where the sixth order three-lobe aberration was 10 mm, the fourth order three-lobe aberration was 63 µm, and the three-fold astigmatism was 78 nm. FIG. 11 shows a profile taken along a dotted line shown in FIG. 11B.

As shown in FIGS. 4A, 4B, and 4C, in a case where there was only sixth order three-lobe aberration, the range of aberration correction was 46 mrad. On the other hand, as shown in FIGS. 11A, 11B, and 11C, in a case where fourth order three-lobe aberration and three-fold astigmatism were added to sixth order three-lobe aberration, the magnitude of the sixth order three-lobe aberration was the same as in the case shown in FIGS. 4A, 4B, and 4C but the range of aberration correction was extended to 77 mrad.

Figure 11C:
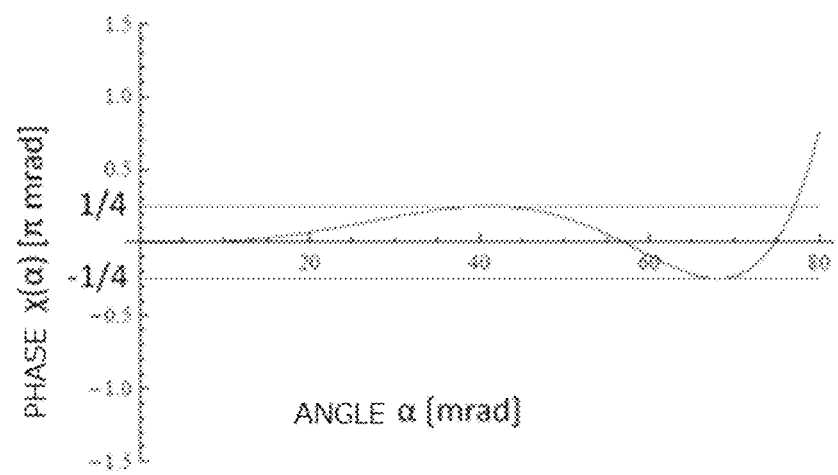
FIG. 11C is a diagram showing a profile taken along a dotted line shown in FIG. 11B.

Note that the allowable amount of phase variation on the lower angle side $k_1$ corresponds to the amount of phase variation at the extreme value on the lower angle side of the graph of FIG. 11C, while the allowable amount of phase variation on the higher angle side $k_2$ corresponds to the amount of phase variation at the extreme value on the higher angle side of the graph of FIG. 11C.

3.2. Operation of Electron Microscope

Figure 12:
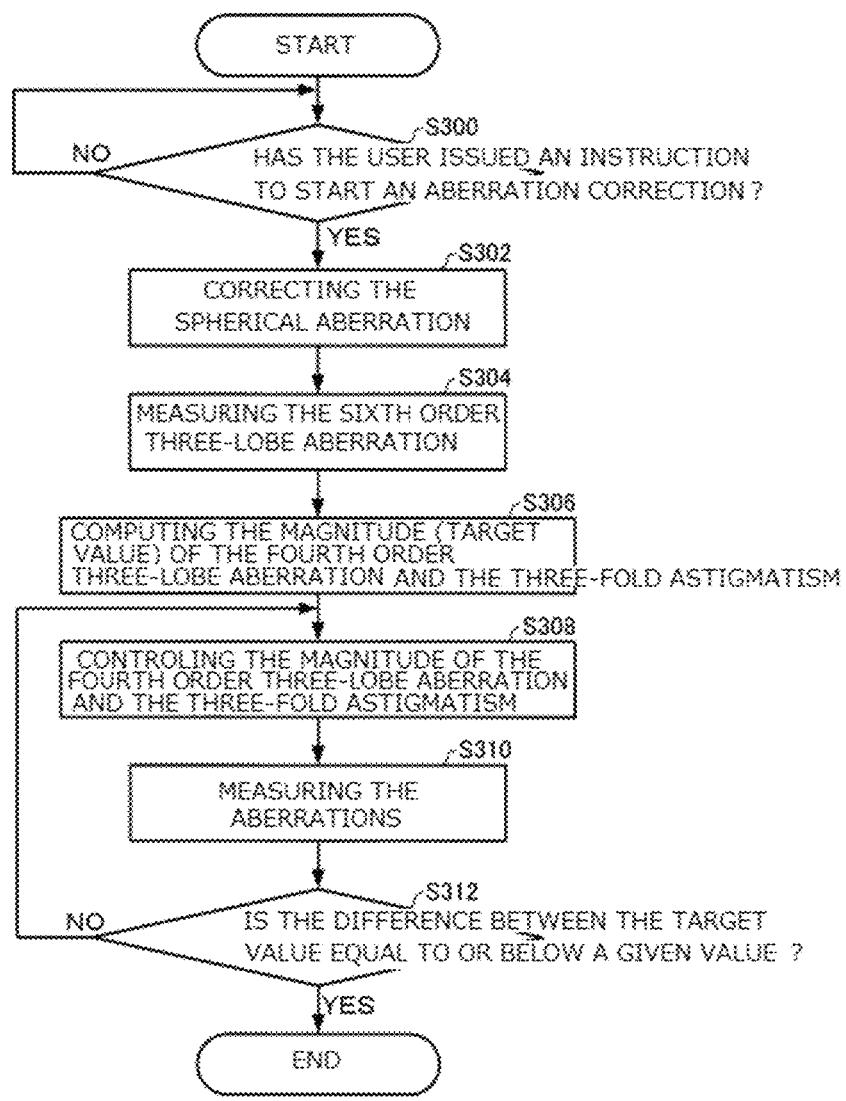
FIG. 12 is a flowchart illustrating one example of subroutine for aberration correction performed by a processor included in an electron microscope associated with a third embodiment.

The operation of an electron microscope associated with a third embodiment is next described. FIG. 12 is a flowchart illustrating one example of subroutine for aberration correction performed by the processor 40 of the electron microscope associated with the third embodiment.

The operations of steps S300, S302, and S304 illustrated in FIG. 12 are carried out similarly to the operations of steps S100, S102, and S104, respectively, illustrated in FIG. 6.

After sixth order three-lobe aberration is measured by the aberration measuring section 44 (after step S304), the computing section 46 computes the magnitude (target value) of fourth order three-lobe aberration and the magnitude (target value) of three-fold astigmatism for reducing phase variations in the electron beam due to sixth order three-lobe aberration and the magnitude (target value) of three-fold astigmatism on the basis of the sixth order three-lobe aberration measured by the aberration measuring section 44 (step S306).

The computing section 46 computes the magnitude (target value) of the fourth order three-lobe aberration and the magnitude (target value) of the three-fold astigmatism, using Eqs. (4) above.

Then, the controller 48 controls the aberration corrector 30 to produce fourth order three-lobe aberration and three-fold astigmatism, based on the magnitudes of the fourth order three-lobe aberration and of the three-fold astigmatism computed by the computing section 46 (step S308).

In particular, the controller 48 generates a control signal for controlling the first transfer lens system 34 and the second transfer lens system 35 on the basis of the computed magnitude of the fourth order three-lobe aberration and sends the signal to the aberration correction power supply controller 31. Furthermore, the controller 48 generates a control signal for controlling at least one of the first multipole element 32a, the second multipole element 32b, and the third multipole element 32c on the basis of the computed magnitude of the three-fold astigmatism and sends the signal to the aberration correction power supply controller 31. Consequently, the aberration corrector 30 produces fourth order three-lobe aberration and three-fold astigmatism.

Then, the aberration measuring section 44 measures aberrations using an SRAM method or a probe-tableau method (step S310).

The controller 48 then makes a decision as to whether two requirements, i.e., (i) the difference between the measured fourth order three-lobe aberration and the target value is equal to or below a given value and (ii) the difference between the measured magnitude of the three-fold astigmatism and the target value is equal to or below a given value, are met (step S312).

If the decision at step S312 is NO, indicating that the above-described requirements are not met, the controller 48 controls the aberration corrector 30 based on the measured fourth order three-lobe aberration and three-fold astigmatism such that the magnitude of the fourth order three-lobe aberration and the magnitude of the three-fold astigmatism approach their respective target values (step S308).

The controller 48 and aberration measuring section 44 repeat the operations of steps S308, S310, and S312 to bring the magnitude of the fourth order three-lobe aberration and the magnitude of the three-fold astigmatism closer to their target values.

If the controller 48 determines that the decision at step S312 is YES, indicating that the requirements are met, the processor 40 ends the subroutine for aberration correction.

The electron microscope associated with the third embodiment has the following features. In the electron microscope associated with the third embodiment, the aberration measuring section 44 measures sixth order three-lobe aberration. The computing section 46 computes the magnitudes of fourth order three-lobe aberration and three-fold astigmatism on the basis of the measured sixth order three-lobe aberration. The controller 48 controls the aberration corrector 30 to produce fourth order three-lobe aberration and three-fold astigmatism on the basis of the result of the computation performed by the computing section 46. Therefore, in the electron microscope associated with the third embodiment, phase variations in the electron beam due to sixth order three-lobe aberration can be reduced by introducing fourth order three-lobe aberration and three-fold astigmatism into the sixth order three-lobe aberration that remains as a dominant aberration after correction of the six-fold astigmatism.

Furthermore, where fourth order three-lobe aberration and three-fold astigmatism are introduced into the sixth order three-lobe aberration as shown in FIGS. 11A, 11B, and 11C, the range of aberration correction is wider than both in the case where only fourth order three-lobe aberration is introduced (see FIGS. 5A, 5B, and 5C) and the case where only three-fold astigmatism is introduced (see FIGS. 8A, 8B, and 8C). Therefore, the electron microscope associated with the third embodiment can provide improved image resolution as compared with the case where only fourth order three-lobe aberration is introduced or the case where only three-fold astigmatism is introduced.

In the electron microscope associated with the third embodiment, the controller 48 controls the aberration corrector 30 to produce fourth order three-lobe aberration such that an angular deviation of 60 degrees is induced between the three-fold field generated by the sixth order three-lobe aberration and the three-fold field generated by the fourth order three-lobe aberration. The controller also controls the aberration corrector 30 to produce third order three-lobe aberration such that an angular deviation of 0 degree occurs between the three-fold field generated by the sixth order three-lobe aberration and the three-fold field generated by the three-fold astigmatism. Consequently, the sixth order three-lobe aberration, fourth order three-lobe aberration, and three-fold astigmatism cancel one another out, thus extending the range of aberration correction.

The method of aberration correction associated with the third embodiment involves the steps of: measuring sixth order three-lobe aberration, computing the magnitude of fourth order three-lobe aberration and the magnitude of three-fold astigmatism for reducing phase variations in the electron beam due to sixth order three-lobe aberration on the basis of the measured sixth order three-lobe aberration, causing the aberration corrector 30 to produce fourth order three-lobe aberration and three-fold astigmatism on the basis of the computed magnitudes of the fourth order three-lobe aberration and of the three-fold astigmatism. Consequently, it is possible to reduce phase variations in the electron beam due to sixth order three-lobe aberration which remains as a dominant aberration in the aberration corrector 30 after correction of the six-fold astigmatism. As a result, image resolution can be improved.

4. Fourth Embodiment

Figure 13:
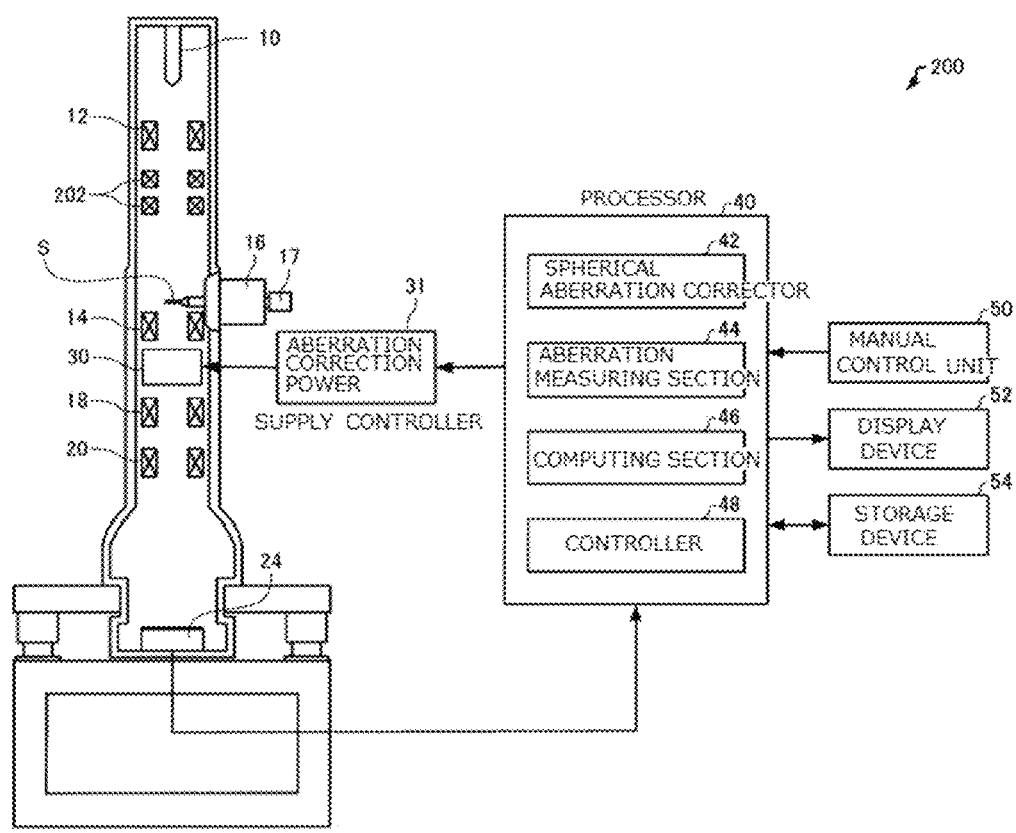
FIG. 13 is a cross section similar to FIG. 1, but showing an electron microscope associated with a fourth embodiment.

An electron microscope associated with a fourth embodiment is next described by referring to FIG. 13, which schematically shows the electron microscope, 200, associated with the fourth embodiment. Those members of the electron microscope 200 which are similar in function to their respective counterparts of the electron microscope 100 associated with the first embodiment are indicated by the same reference numerals as in the above referenced figures and a detailed description thereof is omitted.

In the above-described electron microscope 100 associated with the first embodiment, the aberration corrector 30 is incorporated in the illumination system as shown in FIG. 1. In contrast, in the electron microscope 200 associated with the second embodiment, the aberration corrector 30 is incorporated in the imaging system as shown in FIG. 13.

Furthermore, the above-described electron microscope 100 is a scanning transmission electron microscope (STEM). On the other hand, the electron microscope 200 is a transmission electron microscope (TEM).

The aberration corrector 30 is incorporated in the imaging system of the electron microscope 100. In the illustrated example, the aberration corrector 30 is disposed in a stage following the objective lens 14. The aberration corrector 30 is an instrument for correcting aberrations in the imaging system of the electron microscope 100. More specifically, the aberration corrector 30 is a spherical aberration corrector that corrects spherical aberration in the imaging system by producing negative spherical aberration so as to cancel out positive spherical aberration in the imaging system.

The electron microscope 200 is configured including deflection coils 202 which are located in a stage following the condenser lens system 12. The deflection coils 202 can deflect the electron beam. The deflection coils 202 make it possible to control the angle of impingement of the electron beam on the sample S (sample surface).

In the electron microscope 200, an electron beam emitted from the electron source 10 is focused onto the sample S by the condenser lens system 12. The electron beam transmitted through the sample S is focused by the objective lens 14, intermediate lens 18, and projector lens 20. The focused transmission electron microscope (TEM) image is captured by the imager 24.

In the present embodiment, the aberration measuring section 44 measures aberrations using a diffractogram tableau method. This method is a technique for measuring aberrations by capturing plural TEM images of an amorphous sample with different angles of impingement of the electron beam on the sample surface, Fourier transforming the TEM images to produce a diffractogram, and determining the aberrations based on the diffractogram. The angle of impingement of the electron beam can be controlled by the deflection coils 202.

The electron microscope 200 is identical in operation to the above-described electron microscope 100 except that the aberration measuring section 44 measures aberrations using a diffractogram tableau method and so its description is omitted.

The electron microscope 200 can yield the same advantageous effects as those provided by the electron microscope 100. The configuration of the electron microscope 200 is also applicable to the above-described second and third embodiments.

5. Other Respects

It is to be understood that the present invention is not restricted to the above-described embodiments and that the invention can be implemented in various modified forms without departing from the gist of the present invention.

In the above-described embodiments, the aberration corrector 30 is a three-stage, three-fold field type spherical aberration corrector as shown in FIG. 2. The aberration corrector 30 may also be a two-stage, three-fold field type spherical aberration corrector as shown in FIG. 14.

Figure 14:
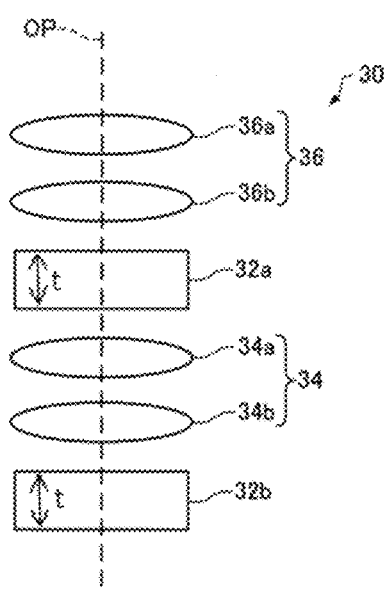
FIG. 14 is a schematic diagram of an aberration corrector associated with a modification of the aberration corrector shown in FIG. 2.

As shown in FIG. 14, the aberration corrector 30 has the first multipole element 32a, the second multipole element 32b, and the transfer lens system 34. In this aberration corrector 30, when fourth order three-lobe aberration is produced, the transfer lens system 34 is used. When three-fold astigmatism is produced, at least one of the first multipole element 32a and the second multipole element 32b is used.

Where the aberration corrector has four or more stages of multipole elements, the technique of the above-described embodiments can also be applied.

It is to be noted that the above embodiments and modifications are merely exemplary and that the invention is not restricted thereto. For example, the embodiments and modifications may be combined appropriately.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those provided by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity required by the Patent Laws, what is desired protected by Letters Patent is set forth in the following claims.

The invention claimed is:

1. A charged particle beam system equipped with an aberration corrector for correcting aberrations in an optical system, said charged particle beam system comprising:
   an aberration measuring section for measuring sixth order three-lobe aberration of sixth order geometric aberration;
   a computing section for computing the magnitude of at least one of fourth order three-lobe aberration of fourth order geometric aberration and three-fold astigmatism of second order geometric aberration for reducing phase variations in a charged particle beam due to the sixth order three-lobe aberration on the basis of the measured sixth order three-lobe aberration; and
   a controller for controlling the aberration corrector to produce at least one of the fourth order three-lobe aberration and the three-fold astigmatism on the basis of the computed magnitude.

2. The charged particle beam system as set forth in claim 1,
   wherein said computing section computes the magnitude of said fourth order three-lobe aberration and the magnitude of said three-fold astigmatism,
   wherein said controller controls said aberration corrector to produce said fourth order three-lobe aberration such that an angular deviation of 60 degrees is induced between a three-fold field generated by said sixth order three-lobe aberration and a three-fold field generated by said fourth order three-lobe aberration, and
   wherein the controller also controls the aberration corrector to produce said three-fold astigmatism such that an angular deviation of 0 degree is induced between the three-fold field generated by the sixth order three-lobe aberration and a three-fold field generated by the three-fold astigmatism.

3. The charged particle beam system as set forth in claim 1, wherein said computing section computes the magnitude of said fourth order three-lobe aberration, and wherein said controller controls said aberration corrector to produce said fourth order three-lobe aberration such that an angular deviation of 60 degrees is induced between a three-fold field generated by said sixth order three-lobe aberration and a three-fold field generated by said fourth order three-lobe aberration.

4. The charged particle beam system as set forth in claim 1, wherein said computing section computes the magnitude of said three-fold astigmatism, and wherein said controller controls said aberration corrector to produce said three-fold astigmatism such that an angular deviation of 60 degrees is induced between a three-fold field generated by said sixth order three-lobe aberration and a three-fold field generated by said three-fold astigmatism.

5. The charged particle beam system as set forth in claim 1, wherein said aberration corrector has a plurality of stages of multipole elements and transfer lens systems disposed between successive ones of the multipole elements, and wherein said controller controls the transfer lens systems to produce said fourth order three-lobe aberration and controls the multipole elements to produce said three-fold astigmatism.

6. A method of aberration correction implemented in a charged particle beam system equipped with an aberration corrector having multiple stages of multipole elements, said method comprising the steps of:
measuring sixth order three-lobe aberration of sixth order geometric aberration;
computing the magnitude of at least one of fourth order three-lobe aberration of fourth order geometric aberration and three-fold astigmatism of second order geometric aberration for reducing phase variations in a charged particle beam due to the sixth order three-lobe aberration on the basis of the measured sixth order three-lobe aberration; and
causing the aberration corrector to produce at least one of said fourth order three-lobe aberration and said three-fold astigmatism on the basis of the computed magnitude.

\* \* \* \* \*